United States Patent
McCall, II et al.

(10) Patent No.: US 7,353,072 B2
(45) Date of Patent: Apr. 1, 2008

(54) METHOD FOR INTERPRETING DESIGN DATA AND ASSOCIATING MANUFACTURING INFORMATION WITH THE DATA AND SOFTWARE AND SYSTEMS FOR IMPLEMENTING THE METHOD

(75) Inventors: Gerald J. McCall, II, Sparta, MI (US); Wolfgang Dienes, Terrebonne (CA)

(73) Assignees: Stiles Machinery, Inc., Grand Rapids, MI (US); 20/20 Technologies Inc., Quebec (CA)

( * ) Notice: Subject to any disclaimer, the term of this patent is extended or adjusted under 35 U.S.C. 154(b) by 0 days.

(21) Appl. No.: 11/479,505

(22) Filed: Jun. 30, 2006

(65) Prior Publication Data

US 2006/0247815 A1    Nov. 2, 2006

Related U.S. Application Data

(63) Continuation of application No. 10/645,392, filed on Aug. 21, 2003, now Pat. No. 7,072,729.

(60) Provisional application No. 60/404,977, filed on Aug. 21, 2002.

(51) Int. Cl.
*G06F 17/50* (2006.01)
*G06F 19/00* (2006.01)

(52) U.S. Cl. .................. 700/97; 700/117; 700/181; 703/1; 716/11

(58) Field of Classification Search .............. 700/97, 700/117, 181, 182; 703/1; 705/26; 716/1–11, 716/19

See application file for complete search history.

(56) References Cited

U.S. PATENT DOCUMENTS

| | | | |
|---|---|---|---|
| 5,940,806 A * | 8/1999 | Danial | 705/26 |
| 6,110,213 A | 8/2000 | Vinciarelli et al. | |
| 6,223,092 B1 | 4/2001 | Miyakawa et al. | |
| 6,236,901 B1 | 5/2001 | Goss | |
| 6,813,610 B1 | 11/2004 | Bienias | |
| 6,847,853 B1 | 1/2005 | Vinciarelli et al. | |
| 2005/0246160 A1 * | 11/2005 | Zimmermann | 704/9 |
| 2006/0052891 A1 * | 3/2006 | Ikeda et al. | 700/97 |
| 2006/0129461 A1 * | 6/2006 | Pankl et al. | 705/26 |

OTHER PUBLICATIONS

European Supplementary Search Report, Sep. 20, 2006.

* cited by examiner

*Primary Examiner*—Leo Picard
*Assistant Examiner*—Sheela Rao
(74) *Attorney, Agent, or Firm*—Price, Heneveld, Cooper, DeWitt & Litton, LLP

(57) ABSTRACT

A method of generating a manufacturing process for producing an assembly and a computer system or systems implementing the method. The method generally includes the steps of: designing at least one assembly to be produced having at least two components to be engaged to one another such that the area where the components are to be engaged thereby defines at least one contact area; generating a representation, typically a three-dimensional representation, of the assembly; assigning a unique identifier to each individual component of the assembly or, when a group of more than one identical components is utilized in the assembly, assigning identical unique identifiers to each component of the group, thereby identifying each component as identical; assigning manufacturing instructions to the contact area; and generating manufacturing instructions for the manufacturing process based at least in part on the identifier and the contact area.

20 Claims, 2 Drawing Sheets

METHOD FOR INTERPRETING DESIGN DATA AND ASSOCIATING MANUFACTURING INFORMATION WITH THE DATA AND SOFTWARE AND SYSTEMS FOR IMPLEMENTING THE METHOD

CROSS-REFERENCE TO RELATED APPLICATIONS

This application is a continuation of U.S. patent application Ser. No. 10/645,392, now U.S. Pat. No. 7,072,729, entitled METHOD FOR INTERPRETING DESIGN DATA AND ASSOCIATING MANUFACTURING INFORMATION WITH THE DATA AND SOFTWARE AND SYSTEMS FOR IMPLEMENTING THE METHOD filed on Aug. 21, 2003, the disclosure of which is hereby incorporated by reference in its entirety. U.S. patent application Ser. No. 10/645,392, now U.S. Pat. No. 7,072,729, claims the benefit of and priority to U.S. Provisional Patent Application No. 60/404,977, filed Aug. 21, 2002, entitled METHOD FOR INTERPRETING DESIGN DATA AND ASSOCIATING MANUFACTURING INFORMATION WITH THE DATA AND SOFTWARE FOR IMPLEMENTING THE METHOD, the disclosure of which is hereby incorporated by reference in its entirety.

BACKGROUND OF THE INVENTION

Traditionally, when designing a method of manufacturing an article, a designer would first create a drawing of the item to be manufactured. The drawing would either be a three-dimensional drawing or a set of drawings consisting of top, side, and front views. Computer aided drafting (CAD) is often used to create the drawing. Once the design is created, the engineering group would take over and machining instructions or manufacturing instructions would be added to the design. If necessary, the design would be altered in order to make the design manufacturable. Unfortunately, this results in significant time-wasting, significant inefficiencies in manufacturing processes, and occasionally overall design forfeiture for failure to create a manufacturable design.

Viewed in more detail, conventionally, once the engineer receives the design from a designer, the engineer must interpret the design and then he or she uses his or her knowledge and design information to engineer the design. Previously, when a design is presented to an engineer in any form, (i.e. sketch, verbal description, drawing, computer file, etc.) the engineer must use his or her skills and talents to translate the design into a feasible manufacturing concept. This is usually an iterative process. The translation of a design into an engineered concept relies heavily on the mental skills and intuition of the engineer translating the design. For example, a person can identify what screw is appropriate for a given situation based on a combination of their knowledge, tools and intuition. This is extended to how many screws are needed as well. They could ask the designer what the purpose of a shelf is, then with this knowledge, determine how to support this shelf based on the designer's requirements. However, if the skill or knowledge of the engineer is at all lacking, the result may be a poorly engineered product. In some cases, the designer and engineer is the same person but the process is largely the same even if the task of converting a design to reality happens simultaneously.

There have been many tools developed, such as a calculator or computer configured with software, to aid in this process, but the method generally remains the same. Significantly, the calculations are made to verify the engineer's assumptions rather than to engineer the design. Prior to the present invention, a person generally reviewed and analyzed each scenario to determine how a product should be made. Typically, this engineering process and its associated costs are amortized over the life of the engineered product and are minimal as a function of its cost. However, when a product is only going to be provided once or in limited numbers, the engineering time and cost can be a significant part of the overall cost of the product and time to manufacture.

When forming a custom designed product, as with a new product, each individual component must be engineered and costs of labor and engineering of the design increase significantly due to the inability of a manufacturer to amortize costs. This is driven to different levels depending on the situation. In one example, an architect's prints and drawings of a kitchen layout for a house is engineered by the cabinet maker that manufactures them. If a customized kitchen is desired, a skilled shop person directly interprets the drawings and executes the detailed manufacturing process by manually calculating in their head. Other times the cabinet maker may have stored their knowledge in software that outputs the information required to build the cabinets. This information can be stored in the form of a spreadsheet or database. Another common form is software designed for detailing cabinets. The software, by combining user input and programmatic instructions created by the developer, outputs the information that is used by the cabinetmaker. In any of the programmatic examples, all engineering must be done before the system can be used for design. This is an unnatural constraint of many systems. The natural process is to have a concept, design the concept, engineer the concept, and manufacture the concept. This is the most natural product development.

In order to accommodate a flexible product scheme and allow customization by the customer, all of the engineering information must be defined and the relevant characteristics exposed in order for the producer to recognize what is being ordered. As the product mix increases, the amount of information required to support this grows at an exponential rate. Therefore, the task of managing this data/information grows as well, placing a burden on the infrastructure supporting the process. The typical "fix" has been to reinforce this infrastructure. This has led to diminished returns as the cycle between the customer's order and shipment are decreased. In many cases, the engineering process internally remains longer than the actual internal manufacturing process. Much of the data mushroom is related to the expression of each product in its unique state and a requirement to store this information for referral later. Even systems specifically designed to reduce this expression use rules and knowledge of a relatively low level and still require large amounts of information to be defined, consuming many man-hours before they are even usable.

The present invention method is designed to minimize the amount of information required to engineer an assembly and to store this information so it can be automatically and intelligently applied to multiple and/or different designs, thereby placing design ahead of engineering in the hierarchy and allowing for manufacturing optimizations and end user designing of custom assemblies of any product. It can also be used to guide designers in the process of designing, if so desired. It will abstract a rule or method to its highest practical point of definition, thus increasing the reusability without further definition.

SUMMARY OF THE INVENTION

According to one aspect of the present invention, a method of generating a manufacturing process for producing an assembly is provided. The method includes the steps of: designing at least one assembly to be produced having at least two components to be engaged to one another, thereby defining at least one contact area; generating a representation, typically a three-dimensional representation, of the assembly (e.g., using drawings, computer-aided drafting (CAD), computer software, etc.); assigning a unique identifier to each individual component of the assembly or, when a group of more than one identical components is utilized in the assembly, assigning identical unique identifiers to each component of the group, thereby identifying each component as identical; assigning manufacturing instructions to the contact area; and generating manufacturing instructions for the manufacturing process based at least in part on the identifier and the contact area.

According to another aspect of the present invention, a system is provided for generating a manufacturing process for producing at least one assembly. The system includes a processor, computer software to implement the method, and optionally, Internet web-pages that allow a remote user to design an assembly and submit the assembly to a manufacturer who will then be able to produce the assembly by following the manufacturing process defined by the identifier of each component and the manufacturing methodology or methodologies for each contact area.

These and other features, advantages and objects of the present invention will be further understood and appreciated by those skilled in the art by reference to the following specification, claims and appended drawings.

DETAILED DESCRIPTION OF PREFERRED EMBODIMENT

Applicant has discovered a surprisingly efficient method for interpreting design data and associating manufacturing information with the data, which greatly enhances efficiencies, both in the design and manufacturing stages of product development and can be utilized in many ways including the generation of manufacturing instructions.

The present method is premised on the understanding of geometric information about a given element. Typically, each component of an assembly is assigned an identifier and the contact areas of each component are identified. The contact area may include the spatial relationship between the two components and, while typically they are in physical contact with one another, the contact area does not necessarily mean the two components contact one another. One utilizing the present method can analyze the contact points between a given component and any other component in an assembly by looking at the geometric expression of the contact area. The next step of an embodiment of the method typically includes examining the geometric expression of the contact area and applying a predefined manufacturing methodology to that contact area. This allows a designer, as well as a computer used by the designer, to automatically understand and change manufacturing methods without having to completely rework all of the details of a product design, whether that design be in drawing form, machine code, computer numerical control (CNC) instructions, computerized visualizations, or any other type of expression of a manufacturing process for a given part. A manufacturing methodology is also typically assigned to each component, which helps facilitate engineering of the individual components when needed.

Figure 1:
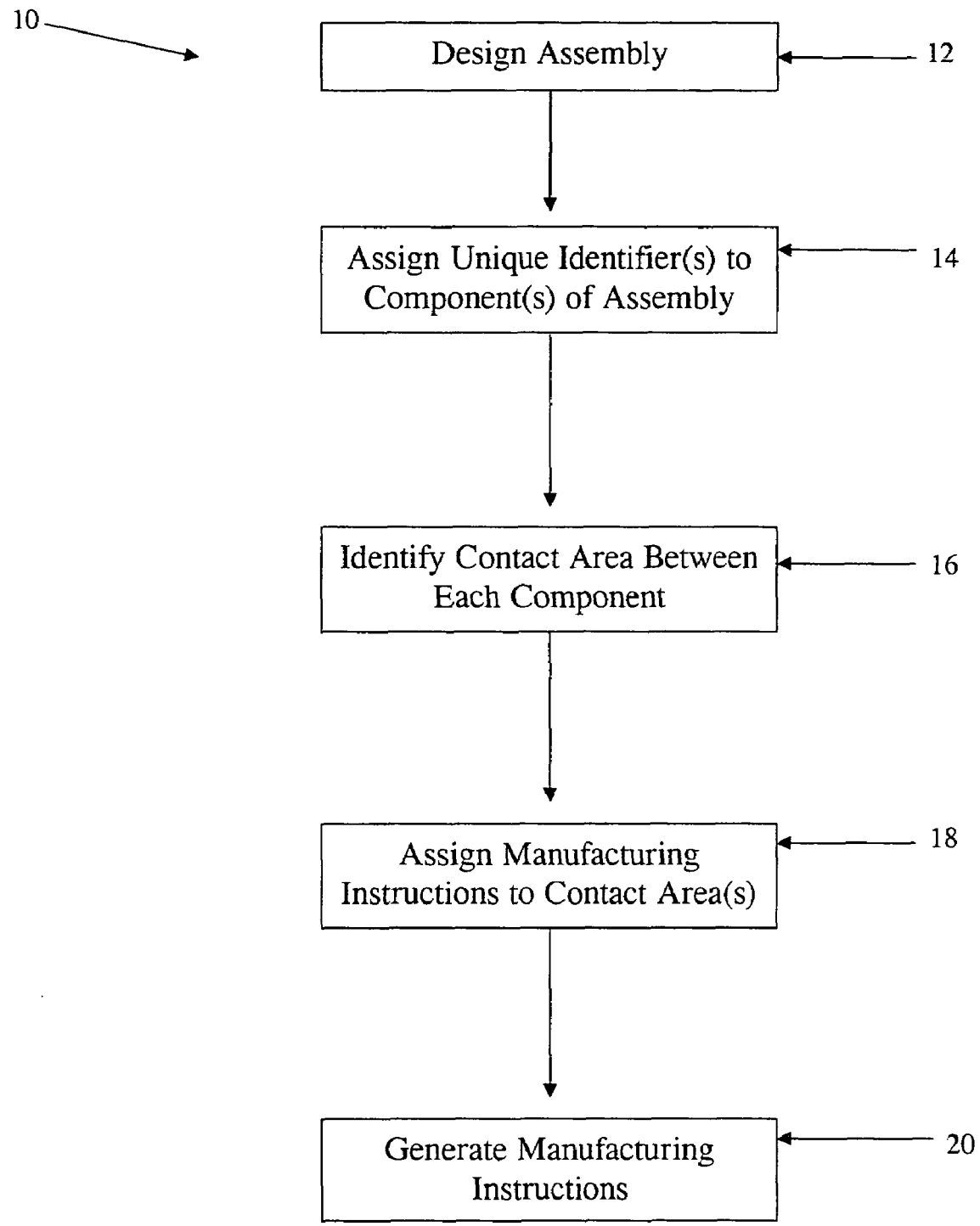
FIG. 1 is a flow diagram illustrating a design process according to one embodiment of the present invention.

More particularly, referring to FIG. 1, in the practice of an embodiment of the method 10 according to the present method, a user may design an assembly as shown in step 12 utilizing any given product design system and/or software to establish a three-dimensional representation of an assembly. Such a representation may be completed by a sketch on a writing surface, utilize a computer-aided drafting (CAD) software program to generate the design, using other software to generate a design, or by utilizing an internal web-site to generate a design. While a two-dimensional rendition of each component may suffice in some instances, each individual part should typically be represented three-dimensionally. Typically this three-dimensional rendering is done as a set of vector points in space or as software-based instructions that resolve to form a solid model or any other method generally known by one of ordinary skill. The resulting design may then be stored either in electronic form, paper form or by other appropriate means, and also optionally employ some other form of identification.

Next, a unique global identification or identifier is assigned to each component of an assembly seen in step 14. Typically, the identifier may be any unique identifier for the component or group of components. Such an identifier may include one or more of the following: a three-dimensional representation in either three-dimensional or two-dimensional form, an alphanumerical identifier, numerical identifier, alphabetical identifier, the physical properties of the component, the size of the component, the shape of the component, or any combination of the above. Any information desired may be incorporated into the identifier.

Moreover, any other unique identifiers can also be used on a given component or group of components. For example, one component of an assembly could be identified by size and shape, while another component can be identified by its material properties, and still another component identified by a numerical value.

Significantly, while FIG. 1 depicts designing the assembly 12 and subsequently assigning a unique component identifier to the components of the assembly 14, it is important to note that in a given application, the unique identifier(s) may be assigned to individual components prior to designing an assembly. This may be most useful and often used where the designer is a lay person. Often, the unique identifier includes information about the manufacturing methodology for each component. This could include information such as dimensions of the component, what finish is to be applied or any other physical attribute of the component. Typically, the identifier would not include manufacturing methodology regarding the contact point, but could in some cases. The manufacturing methodology may be applied to the identifier for each component before or after design of the assembly is complete as well as during the design process.

Once the three-dimensional design has been created by a designer and the identifier assigned for each component of the assembly, the contact area between each component is identified and examined as shown in step 16. Next, each given contact area is assigned a particular manufacturing methodology to construct, assemble, or connect the given components in step 18. Generally, the manufacturing methodology is based at least in part on an analysis of the relationship between the physical properties of each part of the assembly, their position in space relative to one another, and external forces such as gravity and amount of stress/force that will be exerted on a given contact area. For example, a particular manufacturing methodology may be represented as machining instructions such as beveling, drilling, welding, rabbit jointing, or sanding. The manufacturing methodology could also represent hardware such as a bolt, screw, nail, rivet, hinge, etc., which is to be used for the construction of the assembly at the contact area. The manufacturing methodology also may be a combination of machining and hardware instructions, such as hinges for a door that require a recess in one component. Moreover, information about adhesives used for constructing a given assembly and sealants may also be included as a possible manufacturing methodology in addition to the above machining and hardware instructions. Typically, information concerning any and all elements that are used to instruct machines and/or people regarding the way any two given pieces of an assembly need to be held together or connected together, either permanently or temporarily, may be assigned to a given contact point.

By not applying the manufacturing methodology or information to the elements as they relate to the complete assembly, but instead applying the manufacturing methodology or information to the contact points where two elements meet and relate to one another, significant efficiencies are achieved. By analyzing the relationship between given parts and analyzing the part types along with that relationship, an operator is able to make a determination as to what type of manufacturing process is best suited for a given connection of two pieces of an assembly. Moreover, the most efficient use of manufacturing facilities and the resources may be obtained.

In the present method, an operator is not concerned with the particular components that exist within an assembly, except for the area where any two components contact one another. Generally, one is not concerned about the actual components coming into contact, but the focus is on the area where the components come in contact with one another. By applying manufacturing methodology to that area, the method also allows one to add or take away components from a design without impacting its manufacturability and allows the design to automatically respond to a given change immediately without having to reengineer, recreate, redesign, or make a new component.

Because the focus of the present method 10 is on any two given components, A and B, and the space shared or the contact area shared between A and B, by analyzing all three of these elements, the components and the shared contact area, a particular manufacturing process may be defined and manufacturing instructions generated in step 20. One could simply make the adjustment to component A and component B and the manufacturing methodology would adjust to the change based upon the relationship between components. If one wanted to make an adjustment on the methodology to be used on component A and component B, one need only reprocess the information and automatically all instances of that relationship would be updated with the new relationship information.

Prior to employing the inventive method, in the case of designing and manufacturing a kitchen cabinet, for example, the methodology used to derive the machining/automation of this product would not only identify, for example, an end panel A, but within the identification of end panel A, would also identify instructions for all of the parts that would possibly come in contact with panel A. It would be predetermined what parts come in contact with the end panel, such that it would include instructions about if an end panel had a top shelf and bottom shelf, and it would include the machining instructions for the top shelf or the manufacturing instructions for the top shelf in the end panel description. Such instructions might be parametrically driven based on the width of the end panel or may be driven based upon some other factor.

By contrast, engineering a kitchen cabinet design according to the present method, the end panel would be an end panel no matter where it is used within the entire kitchen. The end panel would have a unique set of properties, which could be resolved or reduced to the identification/identifier of the end panel. Typically, such an identifier, as discussed above, includes a single three-dimensional or other representation of the end panel. Therefore, generically, one would describe an end panel with a particular identifier and every time an end panel would be used in the given design that item would be referenced with that identifier. Supposing a kitchen cabinet has a shelf, the shelf is something that would be uniquely identified as a shelf by its own identifier and, therefore, could not be an end panel and an end panel could not be a shelf.

Suppose the end panel, as above, has the letter A as its identifier (as discussed above, this could be any identification, including a three-dimensional representation of an end panel, a vector-driven representation or any other symbol or unique designation) and the shelf has the letter B as its identifier. According to the inventive method, a geometric representation of the individual points comprising a shelf B and the individual points that comprise the end panel A would be represented along with a representation, typically a geometric representation, showing the contact area that is shared between the two parts. Next, according to the present method, one could associate the fact that item end panel A and shelf B are in contact with one another. More particularly, one could further identify that end panel A be produced according to one manufacturing methodology, shelf B produced according to another methodology, and by defining the parameters of the contact area, one could identify the manufacturing methodology to assemble or connect the components. Once all this information is inputted into a computer or otherwise assembled, an operator can analyze all of the information about all of the given components of an assembly and their contact points and manufacturing methodologies.

Also, previous to the inventive method one could define an end panel and a shelf with manufacturing methodology generally assigned to a particular edge of the shelf that is to contact the end panel, such that when a designer places the shelf in the design in contact with the end panel, the manufacturing methodology could transfer to the end panel. More particularly, the defined end panel may just contain dimensional specification such that it is to be six inches wide. The shelf may initially be six inches wide as well with a rule that connecting dowels, for example, will be placed one inch prior to the front of the shelf and one inch from the back. If designed to be connected with one another, this dowel rule could transfer the need for corresponding recesses in the end panel. However, if the designer were to alter the design to make the shelf ten inches wide, the rule contained with the shelf would not accurately transfer to the end panel as the corresponding required recess would have to be in open space. Furthermore, by previous methods, if the shelf and its rules are not utilized precisely as they were defined in the original design, the engineering may be defective. This significantly hinders designers because a designer must select from innumerable elements to generate an engineerable design. By contrast, in the inventive method, the end panel(s) and shelf would contain unique identifiers. The contact area between the end panel and the shelf would define the manufacturing methodology such as connecting with dowels one inch from each end of the contact area.

Using this inventive method allows a designer to modify the dimensions or other characteristics of the components or the manufacturing methodology without the necessity of redefining the manufacturing methodology which would previously have been defined in connection with at least one of the components. Moreover, as discussed in greater detail later, if a design change is made to the components or the manufacturing methodology of the contact area that would result in a potentially poorly designed assembly, software employing the present method may notify a user of the potentially poor design, prompt the user to change a component(s), and/or the manufacturing methodology to correct the potential design defect, or automatically correct a portion of the design to correct the potential design defect thereby better assuring the assembly being produced is free of defects which also free the designer to be more creative and decreases the time to engineer the manufacturing process for an assembly.

Figure 2:
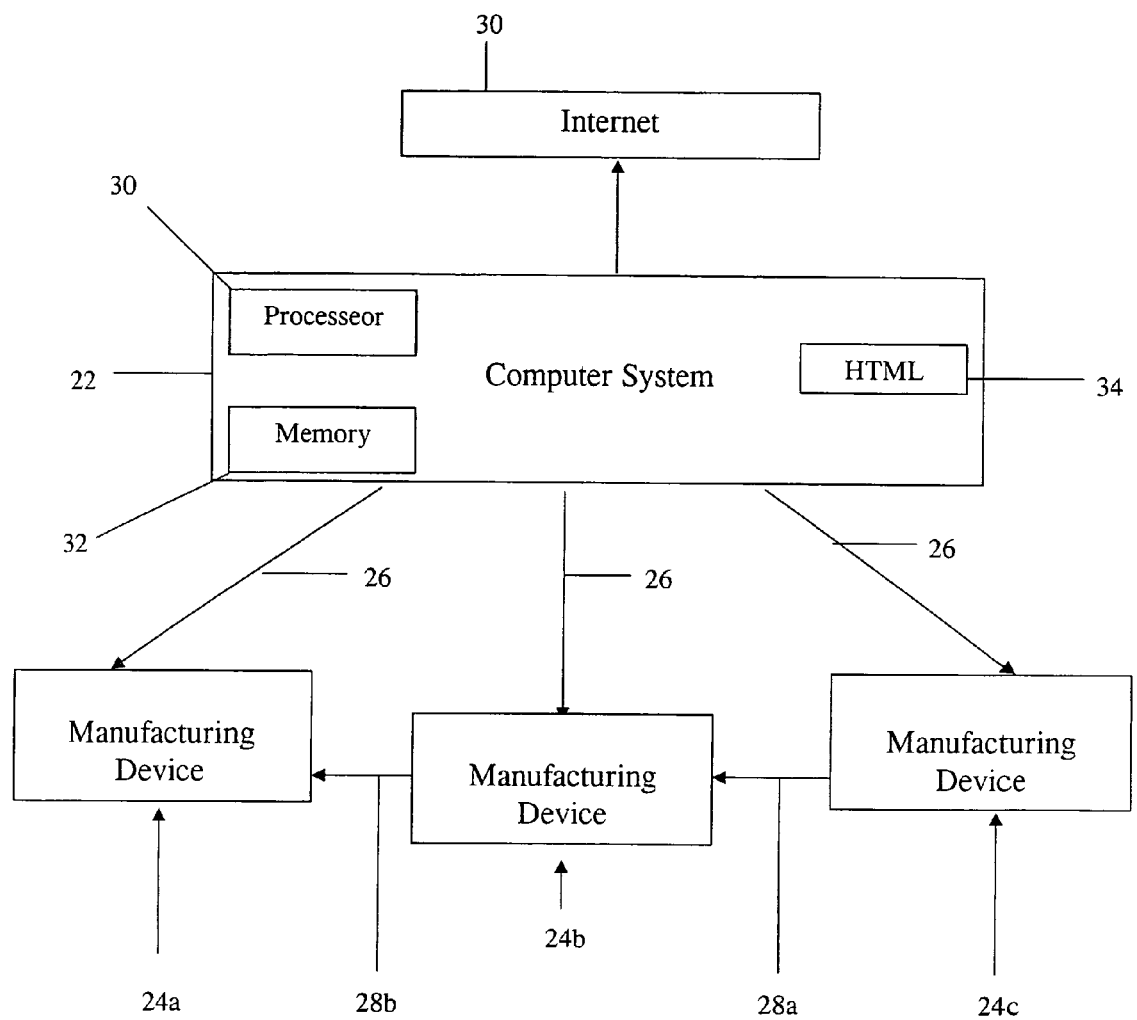
FIG. 2 is a block diagram illustrating a computer utilizing software to employ the design and engineering aspects of the present invention to instruct manufacturer devices how to construct a designed assembly most efficiently based on the individual component identifiers and the contact space identifiers.

The present method can be used to check/determine based upon the identifying information, whether or not a design is manufacturable. If engineering issues are determined to exist such that the design would not be manufacturable, the user may modify the design to correct the issues. Referring to FIG. 2, a computer system 22 is shown that may be employed to implement the method of the present invention. The computer system 22 typically includes a processor 30, memory 32, and computer program/software or other code searches HTML code 34. The computer system 22 may also optionally contain a network connection to the Internet 30 or one of more additional computer systems. The computer program/software may recommend manufacturing methodology changes or the like or allow for a user defined manufacturing methodologies to be entered to supplement the database of possible manufacturing methodologies. The corrections or any modifications to a component or contact area can also result in a cascading effect from one manufacturing component or technique to another such that any component or contact area effected by the change will automatically re-engineer itself to a manufacturable design. Typically, such cascading changes are based upon information contained in the identifiers and contact areas that were not altered by the user.

As an example, a desk has a top and two end panels in the assembly to be constructed.

The unique identifiers assigned to the end panels may define them as a certain shape and as constructed from a certain material such as particle board and by a certain manufacturing methodology, while the top of the desk may be defined as a specific shape and/or as solid oak by the designer. Next, a manufacturing methodology would be assigned to the contact points where the desktop and end panels meet. If, for example, a methodology of merely using an adhesive to connect the end panels with the desktop were designed by the designer/user, based on the weight of the top contained in the identifier in the oak desktop component and the strength of the end panels as a portion of the unique identifier for the end panels, software employing the present method may inform the designer/user of the need to re-engineer the current design, suggest an alternative design such as using solid oak end panels with a higher strength as a portion of their identifier and/or an alternative manufacturing methodology such as using metal support brackets to attach the oak top to the end panels for additional support, or allow the designer/user to provide a new manufacturing methodology through an input method, which would then be incorporated into the design. Ultimately, the end design can be verified and previewed prior to generating final manufacturing instructions and production of the assembly.

In another example, a designer generates a design for a bookshelf with a top panel, two sides, a bottom panel, a back panel, and shelves each having unique identifiers. The contact points and their manufacturing methodologies are defined. The identifier for the shelves may define the shelves as eight inches wide. If the contact point for the shelves is defined as connected to the back panel using hardware that only supports a six inch shelf, software employing the present method would typically indicate the need to change or automatically change the shelf characteristics and/or the manufacturing methodology used to connect the back panel and the shelves to hardware that supports an eight inch shelf such that acceptable construction would be possible. Further, suppose the side panels, top panels, bottom panel, and back panel were made of differing metals and such information was incorporated into their unique identifier and the manufacturing/construction methodology identified was a weld. If a particular weld would not function to connect the components determined based on the individual component identifier information and contact area information, such a fact typically would be identified to the designer so a correction could be made. Significantly, as discussed above, one change to a given component may result in a cascade of recommended or automatic changes in the overall design by changing a series of components based upon known identifiers and/or manufacturing methodologies associated with the connection areas. This significantly accelerates the process for generating an engineered assembly making engineering an assembly virtually automatic, especially when individual components already contain unique identifiers and various predefined manufacturing instructions to be associated with the contact area(s) and component(s).

Additionally, the method of the present invention could be used to design, engineer, and produce an assembly of any known article of manufacture including cabinetry, entire homes or other buildings, vehicles, airplanes, and phone electrical transmission systems. The assembly could also be a component of a larger assembly.

Moreover, the manufacturing methodology of the individual components contained within an identifier and the manufacturing methodologies associated with the contact points of each component may be used to determine what type of manufacturing process is best suited for a given assembly design, or as a means to optimize an entire production facility based upon the manufacturing needs of the various designs to be constructed in a given time frame with specified equipment. Significant efficiencies are gained when multiple assemblies are engineered using the present method. Based at least in part upon the manufacturing methodologies of the components and contact areas of the multiple designs, optimization and proper allocation of machining, human and other resources such as information technology resources in a production facility can be achieved and manufacturing instructions which include at least one task produced. The manufacturing instructions and the individual tasks defined herein are used to construct any designed assemblies in the most efficient manner. Moreover, bottlenecks, if any, in the manufacturing process could be identified as well as potentially underutilized machinery and human resources.

The present method can be achieved electronically, automatically by computer, or manually through associating the information either on paper or some other manual method or combination of the above. Typically, as seen in FIG. 2, a computer system 20, which is optionally connected to the Internet 30 thereby allowing a remote user to design an assembly, communicate manufacturing instructions or process information via a computer network or the Internet 26 to one or more manufacturing devices 24a, 24b, 24c thereby directing the manufacturing devices to complete at least one task defined in the manufacturing instructions. Optionally, these manufacturing devices may be linked to one another directly over a network 28a, 28b. When the manufacturing devices are linked to one another, once the first device has completed its task, the first manufacturing device can communicate this to the next manufacturing device directly without further use of a computer system. Additionally, the manufacturing devices may communicate with one another over a network utilizing one or more computer systems, which may or may not be the computer system 32. The computer system(s) facilitating communication between manufacturing devices subsequently directs a manufacturing device to begin another task once a task is completed. Once informed of the completing of a task, the computer system may direct the manufacturing device to being another task.

The above description is considered that of the preferred embodiment(s) only. Modifications of the invention will occur to those skilled in the art and to those who make or use the invention. Therefore, it is understood that the embodiment(s) shown in the drawings and described above is merely for illustrative purposes and not intended to limit the scope of the invention, which is defined by the following claims as interpreted according to the principles of patent law, including the doctrine of equivalents.

What is claimed is:

1. A method of generating a manufacturing process for producing at least one assembly, said method comprising the steps of:
    designing at least one assembly to be produced comprising at least two components to be engaged to one another such that the area where the components are to be engaged thereby defines at least one contact area;
    generating a representation of the assembly;
    assigning a first identifier to a first component of the assembly or, when a group of more than one identical first components is utilized in the assembly, assigning identical first identifiers to each first component of the group thereby identifying each first component as identical;
    assigning a second identifier to a second component of the assembly or, when a group of more than one identical second components is utilized in the assembly, assigning identical second identifiers to each second component thereby identifying each second component as identical;
    assigning a manufacturing methodology to at least one contact area;
    generating manufacturing instructions for the manufacturing process based at least in part on the first identifier, second identifier, and the contact area; and
    outputting the generated manufacturing instructions for the manufacturing process.

2. The method of claim 1 further comprising assigning a manufacturing methodology to the first identifier and the second identifier.

3. The method of claim 2, wherein at least one computer system is utilized to execute at least one step of the method.

4. The method of claim 3, wherein the computer system directs a computer numerical controlled device.

5. The method of claim 1, wherein the generated manufacturing instructions are in machine readable form and the method further comprises designing the assembly on a computer system remote from a manufacturing facility thereby allowing a remote user to design an assembly independent from the manufacturing facility.

6. The method of claim 5 further comprising the step of shipping the assembly to a user of the remote computer system.

7. The method of claim 5 further comprising the steps of predicting manufacturing costs for varying product designs and monitoring manufacturing cost predictions of varying product designs.

8. The method of claim 5 further comprising the step of reporting to a user one or more design defects between the individual components of the assembly and the assigned manufacturing methodologies of at least one contact area based at least in part on the manufacturing methodologies of the contact area and the identifier for the components.

9. The method of claim 1 further comprising the step of predicting manufacturing costs for varying product designs and monitoring manufacturing cost predictions of varying product designs.

10. The method of claim 1 further comprising the step of modifying the manufacturing instructions generated by modifying the manufacturing methodology assigned to the identifiers, the contact area or both the identifiers and contact area and regenerating the manufacturing instructions.

11. The method of claim 10, wherein the first identifier and second identifier each comprise at least one of the group consisting of a three-dimensional representation, an alpha-numeric identifier, the shape of the component, the material of the component, the numerical identifier, an alphabetical identifier, the size of the component, and any other physical property of the component.

12. The method of claim 1, wherein the first identifier and second identifier each comprise at least one of the group consisting of a three-dimensional representation, an alpha-numeric identifier, the shape of the component, the material of the component, the numerical identifier, an alphabetical identifier, the size of the component and any other physical property of the component.

13. The method of claim 1, wherein the representation of the assembly is generated using at least one of the group consisting of computer-aided drafting software, a writing surface and a writing device, and an Internet web-site.

14. The method of claim 13 further comprising using at least one computer system utilizing at least a portion of the manufacturing instructions to direct at least one machine used to produce the assembly wherein the manufacturing methodology comprises a manufacturing methodology chosen from the group consisting of machining instructions, hardware instructions, and combinations thereof.

15. The method of claim 1 further comprising the step of producing the assembly utilizing the manufacturing instructions for the manufacturing process, wherein the manufacturing instructions comprise one or more tasks performed by a first manufacturing device, a manufacturing instruction generating computer system comprising a processor and memory directs the first manufacturing device to perform at least one task defined at least in part by the manufacturing instructions, the manufacturing instruction generating computer system and the first manufacturing device are connected by a network, and a design computer system located remote from the instruction generating computer system is utilized to design the assembly.

16. A method of producing an assembly comprising the steps of:
providing a design computer system comprising a processor and a memory subsystem coupled to the processor wherein the memory subsystem stores code;
designing an assembly to be produced using the design computer system to generate a three-dimensional representation of the assembly wherein the assembly comprises at least two components and wherein a spatial relationship between the components comprises a contact area;
assigning a first identifier to a first component of the assembly or, when a group of more than one identical first components is utilized in the assembly, assigning the identical first identifiers to each first component thereby identifying each first component as identical;
assigning a second identifier to a second component of the assembly or, when a group of more than one identical second components is utilized in the assembly, assigning identical second identifiers to each second component thereby identifying each second component as identical;
assigning a manufacturing methodology to the contact area;
generating manufacturing instructions for the manufacturing process based at least in part on the first identifier, second identifier, and the contact area; and
outputting the generated manufacturing instructions for the manufacturing process.

17. The method of claim 16, wherein the design computer system is remote from the instruction generating computer system.

18. A method of producing an assembly comprising the steps of:
providing a design computer system comprising a processor and a memory subsystem coupled to the processor wherein the memory subsystem stores code;
designing an assembly to be produced using the design computer system to generate a three-dimensional representation of the assembly wherein the assembly comprises at least two components and wherein a spatial relationship between the components comprises a contact area;
assigning an identifier to identical individual components of the assembly;
assigning a manufacturing methodology to at least one contact area;
generating manufacturing instructions for the manufacturing process based at least in part on the identifiers and the contact area; and
outputting the generated manufacturing instructions for the manufacturing process.

19. The method of claim 18, wherein the design computer system is remote from an instruction generating computer system.

20. The method of claim 19, wherein the design computer system is located remote from a computer system that generates the manufacturing instructions for the manufacturing process and further comprising the step of shipping the assembly to a user of the design computer system.

* * * * *